(12) United States Patent
Aketa et al.

(10) Patent No.: US 8,664,674 B2
(45) Date of Patent: Mar. 4, 2014

(54) LIGHT EMITTING DIODE DEVICE PREVENTING SHORT CIRCUITING BETWEEN ADJACENT LIGHT EMITTING DIODE CHIPS

(75) Inventors: Takanori Aketa, Hirakata (JP); Youji Urano, Ikeda (JP); Tomonori Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 441 days.

(21) Appl. No.: 12/733,402

(22) PCT Filed: Aug. 28, 2008

(86) PCT No.: PCT/JP2008/065419
§ 371 (c)(1),
(2), (4) Date: Feb. 26, 2010

(87) PCT Pub. No.: WO2009/028612
PCT Pub. Date: Mar. 5, 2009

(65) Prior Publication Data
US 2010/0207135 A1  Aug. 19, 2010

(30) Foreign Application Priority Data

Aug. 28, 2007  (JP) .................................. 2007-221865
Aug. 28, 2007  (JP) .................................. 2007-221866

(51) Int. Cl.
*H01L 33/08* (2010.01)
(52) U.S. Cl.
USPC .................................. 257/93; 257/88; 257/91
(58) Field of Classification Search
USPC .................................. 257/88, 91, 93, 98, 99
See application file for complete search history.

(56) References Cited

U.S. PATENT DOCUMENTS 5,125,153 A * 6/1992 Frey et al. ........................ 29/840
2006/0232969 A1 10/2006 Bogner et al.

FOREIGN PATENT DOCUMENTS

| DE | 195 19 549 A1 | 11/1996 |
| JP | 59-065490 A | 4/1984 |
| JP | 61-102787 A | 5/1986 |
| JP | 03-160768 A | 7/1991 |
| JP | 05-013820 A | 1/1993 |

(Continued)

OTHER PUBLICATIONS

Notification of Reasons for Refusal for Japanese Patent Application No. JP 2007-221866 dated Apr. 26, 2011.

(Continued)

*Primary Examiner* — Ori Nadav
(74) *Attorney, Agent, or Firm* — Edwards Wildman Palmer LLP; James E. Armstrong, IV; Stephen D. LeBarron

(57) ABSTRACT

A light emitting device free from void-generation at a bonding between an LED chip and a metal layer provided on a dielectric substrate. This light emitting device is also free from short-circuit between the closely arranged LED chips. This light emitting device includes a plurality of the LED chips, one dielectric substrate (sub-mount member) which is made of a dielectric substrate for holding the LED chips. The dielectric substrate is formed with a plurality of supporting platforms which respectively holds the LED chips. Each supporting platform is provided with a metal layer which is soldered to the LED chip. The supporting platforms are configured to leave a groove between the adjacent ones of the supporting platforms. Each supporting platform is provided at its side surface with a solder-leading portion made of a material having a solder-wettablity higher than that of the supporting platform.

26 Claims, 9 Drawing Sheets

(56) References Cited

FOREIGN PATENT DOCUMENTS

| | | |
|---|---|---|
| JP | 08-088409 A | 4/1996 |
| JP | 2002-232068 A | 8/2002 |
| JP | 2003-347650 A | 12/2003 |
| JP | 2006-502567 T | 1/2006 |
| JP | 2006-080141 A | 3/2006 |
| JP | 2007-088080 A | 4/2007 |

OTHER PUBLICATIONS

International Search Report dated Nov. 18, 2008, issued on PCT/JP2008/065419.

European Search Report dated Apr. 25, 2013 issued in connection with European Application No. 08828205.8.

* cited by examiner

LIGHT EMITTING DIODE DEVICE PREVENTING SHORT CIRCUITING BETWEEN ADJACENT LIGHT EMITTING DIODE CHIPS

TECHNICAL FIELD

This invention relates to a light emitting device using LED chip (light emitting diode chip).

BACKGROUND ART

Light emitting device including a plurality of LED chips and one mounting substrate has been proposed so far. (For example, references 1 and 2). The mounting substrate is formed of a circuit substrate, a sub-mount member, or the like, and arranged to hold the LED chip.

This light emitting device may suffer from short-circuit between the LED chips when adjacent LED chips are closely positioned, by way of an electrically conductive adhesive (e.g., Ag-epoxy resin and solder) and a patterned conductor which is formed at a portion of mounting LED chips on a dielectric substrate (e.g., AlN, $Al_2O_3$, FR5).

When adhesive is applied in small amount on the patterned conductor for overcoming this problem, this light emitting device may suffer from void-generation within bonding portion between the LED chip and the mounting substrate, so as to lose its bonding reliability and its heat-dissipation property.

The reference 1 discloses a light emitting device, in which the mounting substrate is provided with a through hole and a groove. The through hole and groove act to stock therein an extra adhesive, in the process of connecting the LED chip with the conductor pattern on the mounting substrate by means of the adhesive.

The light emitting device of reference 1 includes the mounting substrate which is made of a material having low solder-wettability such as a ceramic (e.g., AlN and $Al_2O_3$) and a glass epoxy resin (e.g., FR5). When the LED chip 110 is mounted on the patterned conductor 131 by way of solder bond in fabrication of this light emitting device, extra liquid solders overflowing from a bonding portion 115 may form solder balls 116, rather than flowing along an inner surface of the stock portion 134, as shown in FIG. 9. As a result, the light emitting device of reference 1 may suffer from short-circuit between adjacent LED chips 110 through bridging solder balls. When LED chip are mounted on a patterned conductor by way of solder in fabrication of the light emitting device of reference 2, extra liquid solders may overflow outside from the LED chip due to a force applied thereon, possibly causing short-circuit through extra solder as well as causing disposition of the LED chips.

Reference 1: Japanese unexamined patent publication 1996-88409 (paragraphs 0011 to 0017 and FIG. 1)
Reference 2: Japanese unexamined patent publication 2006-502567 (paragraph 0032 and FIGS. 3 and 4)

DISCLOSURE OF THE INVENTION

A light emitting device of the present invention has been accomplished in view of the above problem, and intended to prevent void-generation inside a bonding portion between an LED chip and a dielectric substrate. The light emitting device of the present invention is also intended to prevent short-circuit between the LED chips through solder-bonding even when adjacent LED chips are closely positioned.

The LED light emitting device in the present invention comprises a plurality of LED chips, a dielectric substrate, a plurality of dielectric supporting platforms, and a plurality of metal layers. The dielectric supporting platforms are formed on a top surface of the dielectric substrate for mounting thereon the LED chip. Each metal layer is formed on a top surface of each the supporting platform. The metal layer is soldered to the LED chip. The supporting platforms are configured to project from the top surface of the dielectric substrate to leave a groove between the adjacent ones of the supporting platforms. Each supporting platform is provided at its side surface with a solder-leading portion made of a material having a solder-wettablity higher than that of the supporting platform.

When an extra liquid solder overflows from an interface between the LED chip and the dielectric substrate in the process of mounting the LED chip in this configuration, an extra liquid solder is allowed to flow to a bottom of the groove along the solder-leading portion, and prevented from forming voids and solder balls. As a result, the light emitting device enables to suppress void-generation inside a bonding portion between the LED chip and the metal layer on the dielectric substrate, as well as preventing short-circuit between the LED chips through solder even when adjacent LED chips are closely positioned.

Preferably, the solder-leading portion has an extension which extends on the bottom of the groove, such that the liquid solder is allowed to flow in wider area after overflowing from the interface between the LED chip and the metal layer on the dielectric substrate. This configuration can further prevent the solder-ball generation.

More preferably, the solder-leading portion is made of the same material as the metal layer, and the extensions extending respectively from the adjacent ones of the solder-leading portions are electrically isolated from each other. In this arrangement, it is possible to simultaneously form the solder-leading portion and metal layer, enabling to reduce its production cost.

More preferably, the groove is provided at its bottom with a dielectric barrier which protrudes between the supporting platforms, so as to further prevent short-circuit between the adjacent LED chips.

More preferably, the barrier is configured to have a top lower than that of the supporting platform, so as to allow the adjacent LED chips 10 to be closely positioned.

More preferably, the barrier is formed integrally with the dielectric substrate. With this arrangement, it is possible to reduce manufacturing cost and precisely position the barriers.

More preferably, the supporting platform is configured to have a plane size smaller than the LED chip. This arrangement enables to employ the following process of aligning the LED chip on the metal layer: the process is initiated by applying solder in suitable amount on the metal layer. Next, the LED chip is allowed to suitably align due to surface tension. This process enables to precisely position the LED chip. In this process, the solder is prevented from overflowing outside from the LED chip as viewed from above, thereby preventing short-circuit between the LED chips even when adjacent LED chips are closely positioned.

BEST MODE FOR CARRYING OUT THE INVENTION

Figure 1:
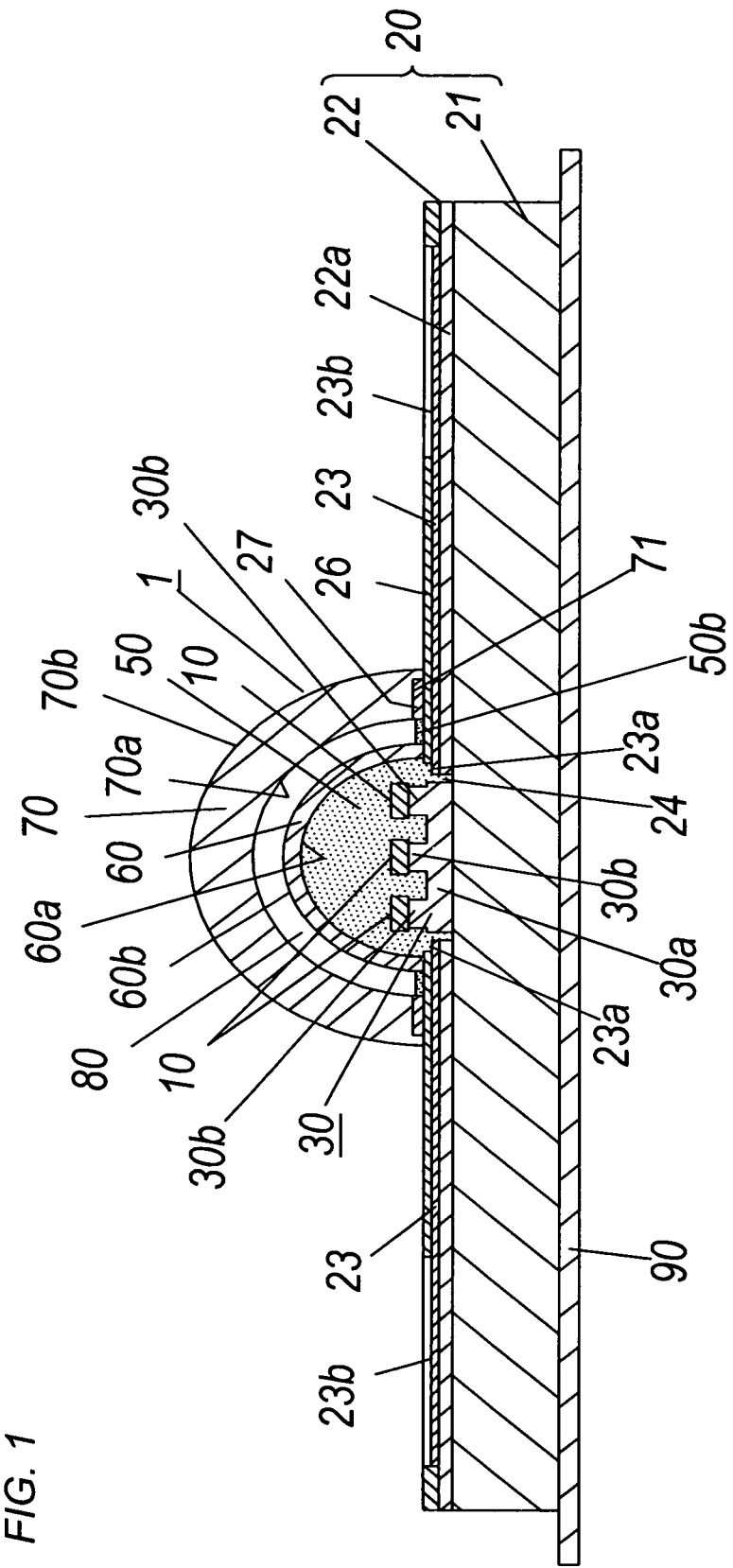
FIG. 1 shows a front sectional view of a light emitting device of the present invention, in accordance with one embodiment.
Figure 2:
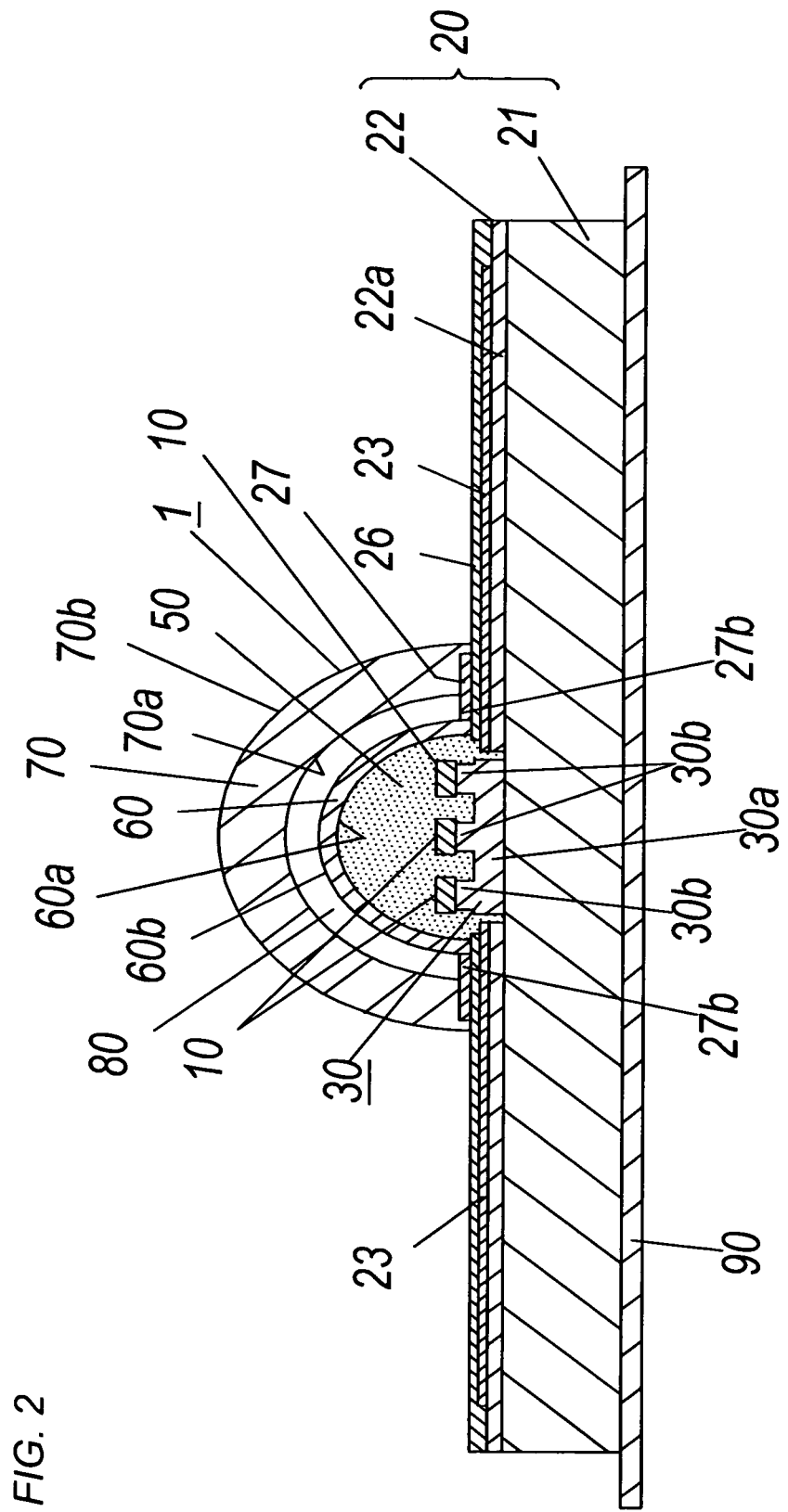
FIG. 2 shows a side sectional view of the above light emitting device.
Figure 3:
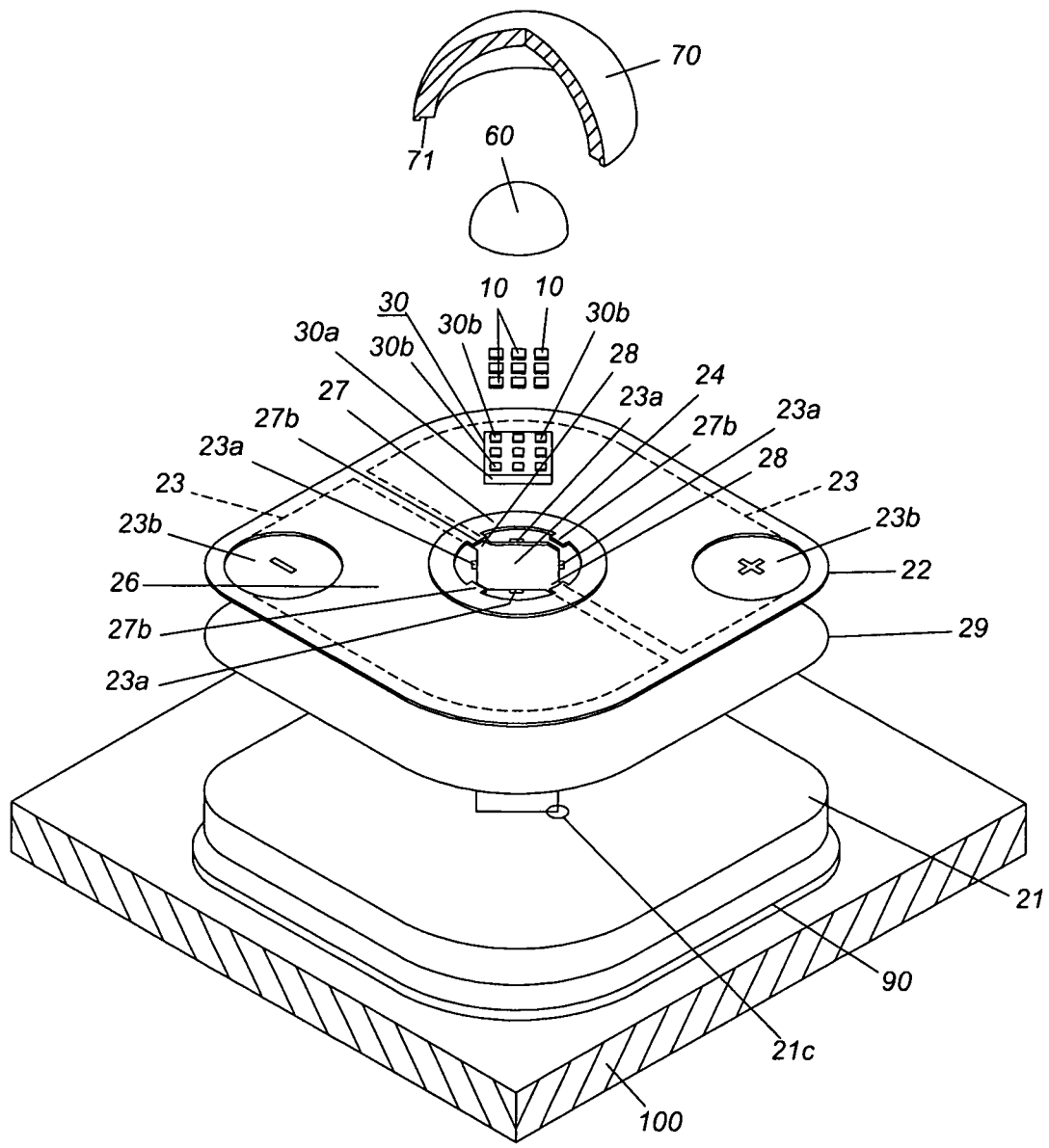
FIG. 3 shows a partially explored perspective view of the above light emitting device.

Hereafter, explanations are given as to a light emitting device in this embodiment with reference to FIGS. 1 to 3. The light emitting device 1 in this embodiment comprises a plurality of (nine in this embodiment) LED chips 10, a mounting substrate 20 shaped like a rectangular plate, a light-transmissive elastic encapsulation resin 50, a dome-shaped optical member 60, and a dome-shaped color conversion member 70. The mounting substrate 20 is provided at its top surface with a ring gate 27. The ring gate 27 is formed outside of the optical member 60 to protrude from the top surface of the mounting substrate 20. The mounting substrate 20 is provided at its top surface with the LED chip 10 and a patterned conductor 23 which supplies electric power to a series circuit connecting a plurality of LED chips 10. The encapsulation resin 50 is filled in a space confined between the optical member 60 and the mounting substrate 20 for encapsulating therewith the LED chip 10 and a plurality of bonding wirings (not shown) in electrical connection with the LED chip 10. The optical member 60 is secured to the top surface of the mounting substrate 20 to cover the LED chip 10 for directing a light emitted from the LED chip 10 therethrough. In the process of disposing the optical member 60 securely to the mounting substrate 20, an extra encapsulation resin may overflow from the space confined between the optical member 60 and the mounting substrate 20 for encapsulating therewith the LED chip 10. The ring gate 27 acts to prevent the extra encapsulation resin from flowing outside therethrough. The dome-shaped color conversion member 70 is a molded product made of a transparent resin material and a phosphor. The phosphor is excited by a light which is emitted from the LED chip 10 and then travels through the encapsulation resin 50 and the optical member 60, so as to emit a light of a color different from a luminescent color of the LED chip 10. The color conversion member 70 is disposed on the top surface of the mounting substrate 20, so as to surround the optical member 60 with an air layer 80 being interposed between the optical member 60 and the color conversion member 70.

The light emitting device 1 in this embodiment is provided at a bottom surface of the mounting substrate 20 with a sheet-shaped connecting member 90. The connecting member is made of a resin sheet which contains a filling material made of filler (such as silica and alumina) and exhibits a low viscosity when heated. (The resin sheet may be an organic green sheet such as an epoxy resin sheet highly filled with fused silica.) When utilized as a light source of a luminaire, the light emitting device 1 in this embodiment enables to connect a main body 100 (shown in FIG. 3) made of a metal (e.g., a highly thermally conductive metal such as Al and Cu) to the mounting substrate 20 by way of the connecting member 90. The resin sheet of the connecting member 90 exhibits very low electrical conductivity, high thermal conductivity, high fluidity when heated, and high adhesion to bumpy surfaces. In the process of connecting the mounting substrate 20 with the main body 100, the connecting member 90 is subjected to heat while being interposed therebetween. The connecting member enables to connect therethrough the mounting substrate 20 with the main body 100, without suffering from a void-generation, a rise in thermal resistance, and an ununiformity in thermal resistance which result from lack of adhesion. When interposed between the mounting substrate and the main body as in the light emitting device of this embodiment, the connecting member enables to minimize the thermal resistance between the LED chip 10 and the main body 100 for facilitating heat dissipation, compared to a conventional heat exhaustion rubber such as Sarcon (registered trademark). Besides, this connecting member enables to minimize ununiformity in the thermal resistance and the rise in junction temperature of the LED chip 10. With the use of connecting member, the light emitting device in this embodiment is allowed to accept an increased input electric power for giving a high light output. When being utilized as a light source of luminaire, a plurality of the light emitting devices may be connected with each other in series or parallel on the main body 100.

The LED chip 10 is a GaN-based blue-color LED chip emitting a blue light. The anode (not shown) and the cathode (not shown) are respectively provided on the top surface and the bottom surface of the LED chip 10. The anode and the cathode may be respectively provided on different surfaces of the LED chip 10, while being connected to patterned conductor acting as the metal layer by means of wire bonding or the like.

The mounting substrate 20 is composed of a rectangular heat conducting plate 21 and a printed substrate 22 disposed on a one surface (i.e., top surface in FIGS. 1 and 2) of the heat conducting plate 21. The printed substrate 22 is formed of a rectangular flexible printed substrate which is secured to a securing sheet 29 (shown in FIG. 3) such as a polyolefin sheet. The printed substrate 22 is formed at its middle position with a rectangular opening 24. A dielectric substrate (i.e., a submount member) 30 is disposed on the one surface of the heat conducting plate 21 to pass through the opening 24 of the printed substrate 22. Each LED chip 10 is disposed on the dielectric substrate 30. In this configuration, the heat generated from the LED chip 10 is allowed to be dissipated through the dielectric substrate 30 and the heat conducting plate 21, and not introduced to the printed substrate 22. The heat conducting plate 21 is provided at its top surface with an alignment mark 21c which allows the dielectric substrate 30 to be precisely positioned. The heat conducting plate 21 is formed of Cu in this embodiment, but may be formed of other thermally conductive material such as Al.

The printed substrate 22 includes a dielectric plate 22a. The dielectric plate 22a is made of a polyimide film. The dielectric plate 22a is provided at its top surface with a pair of patterned conductors 23 which supplies electricity to a series circuit connecting a plurality of the LED chips 10, and a protection layer 26 made of white resist (resin). The protection layer 26 is arranged to reflect outward a light which is emitted from a lateral face of each LED chip 10, and prevent the light from being absorbed into the printed substrate 22. With this arrangement, the light emitting device is allowed to efficiently direct outward the light, for giving an improved light output. Each of the patterned conductors 23 is formed into substantially rectangular shape, and has a dimension marginally smaller than half of dimension of the dielectric plate 22a. The dielectric plate 22a may be formed of FR4, FR5, paper phenol, or the like.

The protection layer 26 is disposed to expose rectangular four terminal portions 23a of the patterned conductor 23 around a periphery of the opening 24, and two circular electrodes 23b near circumference of the printed substrate 22. The terminal portions 23a are respectively connected to bonding wires 14. Each patterned conductor 23 of the printed substrate 22 is formed of a laminate including Cu film, Ni film, and Au film. One of two electrodes 23b indicated by "+" (right one in FIG. 3) is electrically connected to the anode of the LED chip 10 at higher electric potential side; the other indicated by "−" (left one in FIG. 3) is electrically connected to the cathode of the LED chip 10 at lower electric potential side. The electrodes with signs of "+" and "−" are visually identified, and may be free from erroneous electrical connection thereof.

Each LED chip 10 is disposed to the heat conducting plate 21 with the dielectric substrate 30 being interposed therebetween. The dielectric substrate acts to relieve stress acting on the LED chip 10 due to a difference of coefficient of linear expansion between the LED chip 10 and the heat conducting plate 21. In this embodiment, the dielectric substrate 30 is formed to have a mounting surface with a dimension larger than the total area in plane size of the LED chips 10.

The dielectric substrate 30 also acts to dissipate heat generated from the LED chip 10 to the heat conducting plate 21 which has a dimension larger than a chip size of the LED chip 10, as well as relieving the stress. In the light emitting device 1 in this embodiment, each LED chip 10 is disposed to the heat conducting plate 21 with the dielectric substrate 30 being interposed therebetween. With this configuration, the dielectric substrate 30 enables to relieve a stress which acts on each LED chip 10 due to a difference of coefficient of linear expansion between the LED chip 10 and the heat conducting plate 21. Besides, the heat generated from the LED chip 10 can be efficiently dissipated through the dielectric substrate 30 and the heat conducting plate 21.

Figure 4:
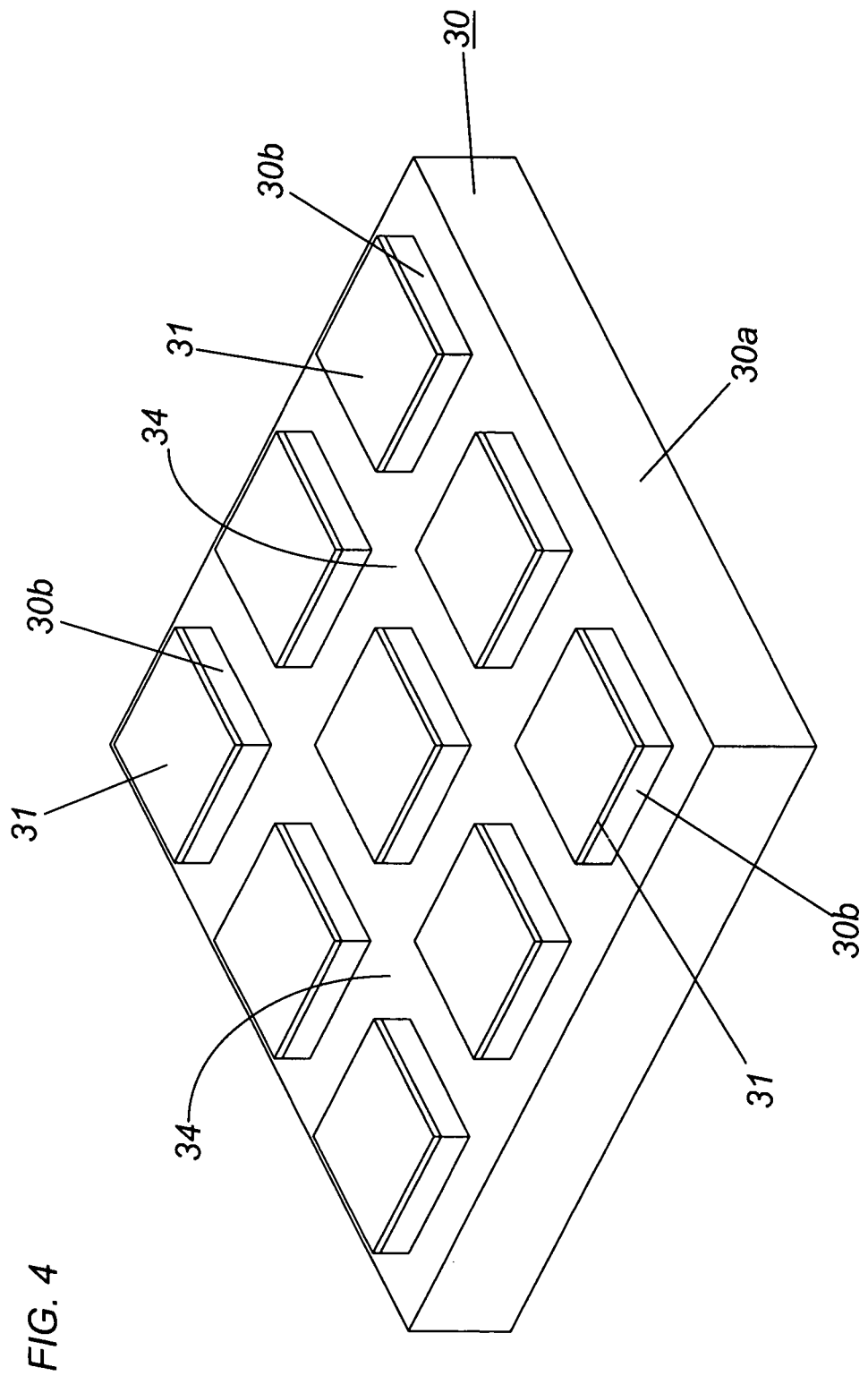
FIG. 4 shows a schematic perspective view of a dielectric substrate.

As shown in FIG. 4, the dielectric substrate 30 is shaped like rectangular, and made of dielectric AlN exhibiting relatively high thermal conductivity. The dielectric substrate 30 is provided at its top surface with a plurality of supporting platforms 30b each of which mounts thereon the LED chip 10. The supporting platforms 30b are configured to leave a groove 34 between adjacent ones of the supporting platforms 30b. Each supporting platform of the dielectric substrate 30 is provided with a metal layer 31. The LED chips 10 are respectively connected to a plurality of the metal layers 31 by means of solder (e.g., a Pb-free solder such as AuSn and SnAgCu). Each supporting platform 30b is integrally formed with a base 30a of the dielectric substrate 30. This configuration allows each supporting platform 30b to be precisely positioned.

In the light emitting device 1 of this embodiment, the dielectric substrate 30 is arranged to be thick enough to have a top higher than that of the protection layer 26. With this arrangement, the light emitted from a lateral face of the LED chip 10 is prevented from being absorbed into the printed substrate 22 through an inner wall of the opening 24. The metal layer 31 may be formed of a laminate, which is formed of a Ti layer acting as a securing layer, a Pt layer acting as a diffusion prevention layer, and an Au layer. The securing layer of the metal layer may be formed of Ta, Ni, W, Zr, Hf, Cr, or the like, instead of Ti. The diffusion prevention layer of the metal layer may be formed of Ni, Pd, Rh, Ru, W, or the like, instead of Pt.

The encapsulation resin 50 is made of silicon resin, but may be made of other one such as acryl resin.

The optical member 60 is a dome-shaped molded article made of light-transmissive material (e.g., silicone resin and glass). In this embodiment, the optical member 60 is a molded article made of silicone resin, enabling to minimize differences in refractive index and linear expansion coefficient between the optical member 60 and the encapsulation resin 50. Preferably, the optical member 60 is made of an acryl resin when the encapsulation resin 50 is an acryl resin.

Preferably, the light output surface 60b of the optical member 60 is shaped into a convex surface such that an interface between the light output surface 60b and the air layer 80 is free from a total reflection of the light radiated from the light input surface 60a. In this embodiment, the light is allowed to easily travel to the color conversion member 70, after emitted from the LED chip 10, such that the light emitting device enables to give an increased overall light flux. After emitted from lateral face of the LED chip 10 and passing through the encapsulation resin 50, the optical member 60, and an air layer 80, one portion of the light excites the phosphor inside the color conversion member 70. The other portion of the light travels inside the color conversion layer 70 without colliding with the phosphor. The optical member 60 is designed to have a constant wall thickness over the entire surface.

The color conversion member 70 is a molded article made of a mixture of the light-transmissive material (e.g. silicone resin) and yellowish phosphor particles. Each phosphor particle is excited by a blue light emitted from the LED chip 10 to emit a broad yellow-light. (Namely, the color conversion member 70 contains phosphors). The light emitting device 1 in this embodiment enables to radiate the blue-light emitted from the LED chip 10 and the yellow-light emitted from the yellowish fluorescent material, through the outer surface 70b of the color conversion member 70. This light emitting device 1 allows the blue-light and the yellow-light to be mixed with each other for giving a white-color light. The color conversion member 70 is made of silicone resin in this embodiment, but may be made of other light-transmissive material such as an acryl resin, a glass, an organic-inorganic hybrid material which is made of a mixture of organic and inorganic nanoparticles or an organic-inorganic hybrid molecule including organic and inorganic moieties. The phosphor in the color conversion member 70 is the yellowish phosphor in this embodiment, but may be a combination of other fluorescent materials such as a combination of reddish and greenish ones for achieving white-color light.

The color conversion member 70 is shaped to fit to the light output surface 60b of the lens 60 such that an inner surface 70a of the color conversion member 70 is spaced from the light output surface 60b of the lens 60 by an almost uniform distance, and configured to have a constant wall thickness over the entire surface. The color conversion member 70 needs to be secured at its edge (its peripheral bottom rim) to the mounting substrate 20 by means of adhesive agent (e.g., silicone resin and epoxy resin).

The luminaire in which the light emitting device 1 is utilized as a light source has a circuit substrate (not shown) including a dielectric board (not shown). The dielectric board is provided at its top surface with patterned wiring (not shown) defining an electrical connection of a plurality of light emitting devices 1. A plurality of the light emitting devices 1 are connected with each other in series in this embodiment, but may be connected in parallel or connected in a series-parallel combination. The circuit substrate is disposed inside the main body 100 shaped like short cylinder so as to be spaced away from a bottom wall of the main body 100. The circuit substrate is formed with openings for allowing a portion of each light emitting device to pass therethrough. The main body 100 may be formed into other shape such as plate-like.

The sheet-shaped connecting member 90 in the light emitting device 1 of this embodiment is formed to have a connection surface larger than that of the heat conducting plate 21, enabling to increase a creepage distance between the heat conducting plate 21 and the main body (metallic member) 100, and eventually improving thunder-resistance surge, compared to a connecting member 90 in which its connection surface has the same dimension as that of the heat conducting plate 21. (Outdoor luminaire is required to have a creepage distance different from that of indoor luminaire, between the light emitting device and the metallic member. Outdoor luminaire needs to have the creepage distance longer than that of the indoor luminaire.) The thickness of sheet-shaped connecting member 90 needs to be determined in accordance with a required pressure-resistance of the thunder-resistance surge. The sheet-shaped connecting member 90 is preferably formed thin for reducing a thermal resistance. Namely, the connecting member 90 needs to have a suitable thickness and a suitable plane size so as to meet the requirement of the creepage distance.

The light emitting device 1 can be fabricated in the following process. The LED chips 10 are mounted on the dielectric substrate 30, and then connected with each other in series through the bonding wires. Next, one portion of a liquid encapsulation resin (e.g., silicone resin) is poured through a hole 28 (which is formed continuously with the opening 24) to be filled inside the opening 24 of the printed substrate 22 around a periphery of the sub-mount member 30, so as to be cured to become one portion of the encapsulation resin 50. Next, the optical member 60 is filled at its interior with the other portion of the liquid encapsulation resin (e.g., silicone resin). Subsequently, the optical member 60 are suitably positioned on the mounting substrate 20, so as to be secured to the mounting substrate 20 while the liquid encapsulation resin is cured to become the encapsulation resin 50. Finally, the color conversion member 70 is secured to the mounting substrate 20. In the above fabrication example of the light emitting device, the liquid encapsulation resin needs to be provided to the interior of the optical member 60 sufficiently so as to prevent void-generation inside the encapsulation resin 50.

In the light emitting device 1 in this embodiment, the mounting substrate 20 is provided at its top surface with the annular ring gate 27 which is formed to protrude therefrom outside of the optical member 60. In the process of disposing the optical member 60 securely to the mounting substrate 20, an extra encapsulation resin may overflow from the space confined between the optical member 60 and the mounting substrate 20 for encapsulating therewith the LED chip 10. The ring gate 27 acts to prevent the extra encapsulation resin from flowing outside therethrough. The ring gate 27 is formed of a white resist. The ring gate 27 is provided with a plurality of (four in this embodiment) centering projections 27b extending inward from its inner circumference. These centering positions are equally spaced circumferentially along inner circumference of the ring gate, so as to locate circumferentially around the center axis of the optical member 60. The centering positions 27b act to position the color conversion member 70. The number of the centering positions 27b is four in this embodiment, and preferably three or more. Each centering position 27b is preferably formed to have a small width such that the encapsulation resin can be stored in high amount into a portion confined between the ring gate 27 and the optical member 60.

The process of fabricating the light emitting device in this embodiment enables to prevent void-generation inside the encapsulation resin 50, so as to provide a reliable light emitting device 1 giving high light output. A liquid encapsulation resin is filled into a portion confined by the optical member 60, the ring gate 27, and the protecting layer 26 on the mounting substrate 20, so as to be cured to become a resin portion 50b between the optical member 60 and the ring gate 27 in FIG. 1.

The color conversion member 70 is formed at inner peripheral bottom rim with a recess 71 for engaging with the ring gate 27. The light emitting device in this embodiment allows to precisely position the color conversion member 70 in relation to the mounting substrate 20, as well as shortening an interval between the color conversion member 70 and the optical member 60. The recess 71 is formed across the inner peripheral bottom rim and inner face 70a.

In the light emitting device of this embodiment, the mounting substrate 20 is provided at its top surface with the patterned conductor 23 which supplies electricity to the series circuit connecting the LED chips 10. In this configuration, the mounting substrate 20 is thermally coupled to the main body 100 of the luminaire without being provided on the circuit substrate. This configuration enables to reduce a thermal resistance from the LED chip 10 to the main body 100, and facilitate heat dissipation. This configuration enables to suppress a rise in a junction temperature of each LED chip 10, thereby allowed to accept an increased input power for giving a high light output. In the light emitting device 1, the mounting substrate 20 is provided at its top surface with the ring gate 27. The ring gate 27 enables to prevent void-generation inside the encapsulation resin 50, in fabrication of the light emitting device.

Figure 5:
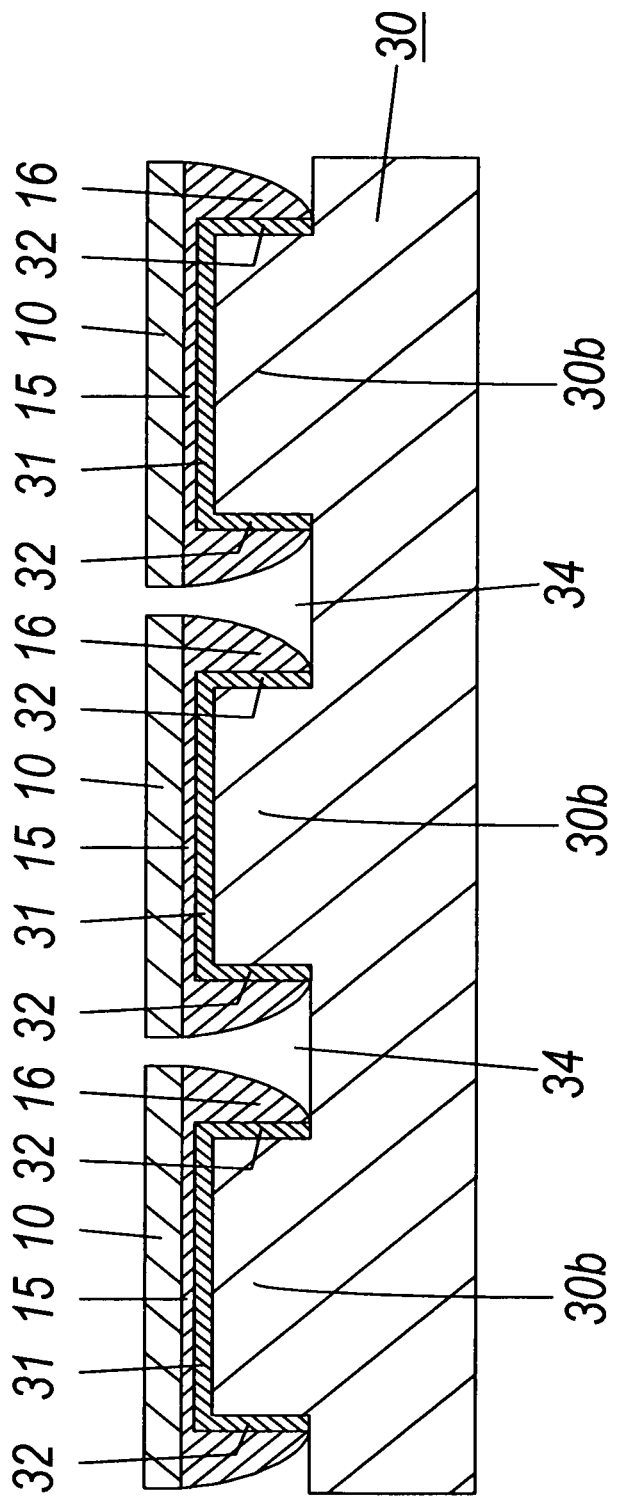
FIG. 5 shows a schematic sectional view of essential part of the dielectric substrate.

The dielectric substrate 30 is provided with a plurality of the supporting platforms 30b each of which holds the metal layer 31 thereon. The supporting platforms are configured to leave the groove 34 between the adjacent ones thereof, as described above. As shown in FIG. 5, each supporting platform 30b is provided on its side surface with a solder-leading portion 32 made of a material having a solder-wettablity higher than that of said supporting platform 30b. This configuration is intended to flow a liquid solder overflowing from an interface between the LED chip and the dielectric substrate, to a bottom surface of the groove 34 along the solder-leading portion 32, when the LED chip is mounted to the supporting platform 30b. In this embodiment, the dielectric substrate 30 is formed of a dielectric material such as AlN. The solder-leading portion 32 is made of the same material as that of metal layer 31, so as to be simultaneously formed with the metal layer 31 for reducing its manufacturing cost. The solder-leading portion 32 is continuously formed at its circumference with the metal layer 31 along a side face of the supporting platform 30b. Each of the metal layer 31 and the solder-leading portion 32 may be formed by means of spattering, vapor deposition, plating, or the like.

In fabrication of the light emitting device in this embodiment, the solder is applied in a predetermined amount on the metal layer 31 in advance. Next, the LED chip 10 is disposed by way of the solder to the metal layer 31 which is provided on the dielectric substrate 30. Next, the LED chip 10 is bonded to metal layer 32 through the solder in the presence of a suitable force applied on the LED chip 10 while the dielectric substrate 30 is subjected to heat. In this process, an extra liquid solder overflows from an interface between the LED chip 10 and the metal layer 31 provided on the supporting platform 30b of the dielectric substrate 30. The light emitting device in this embodiment allows the extra liquid solder to flow to the bottom of the groove along the solder-leading portion 32 to become an extra solder portion 16, so as to prevent generations of solder balls and voids. This light emitting device in this embodiment enables to prevent void-generation inside a bonding portion 15 between the LED chip 10 and the metal layer 31 which is provided on the supporting platform 30b of the dielectric substrate 30. This light emitting device also enables to prevent the LED chips 10 or electrodes disposed on different surfaces of either LED chip 10 from being short-circuited by way of solder-balls which result from liquid solder overflowing from the interface between the LED chip 10 and the metal layer 31, even when adjacent LED chips are closely positioned. This light emitting device allows the LED chip 10 to be reliably secured to the metal layer 31 by means of the bonding portion 15 and the extra solder portion 16 which are continuously formed to the solder-leading portion 32.

Figure 6:
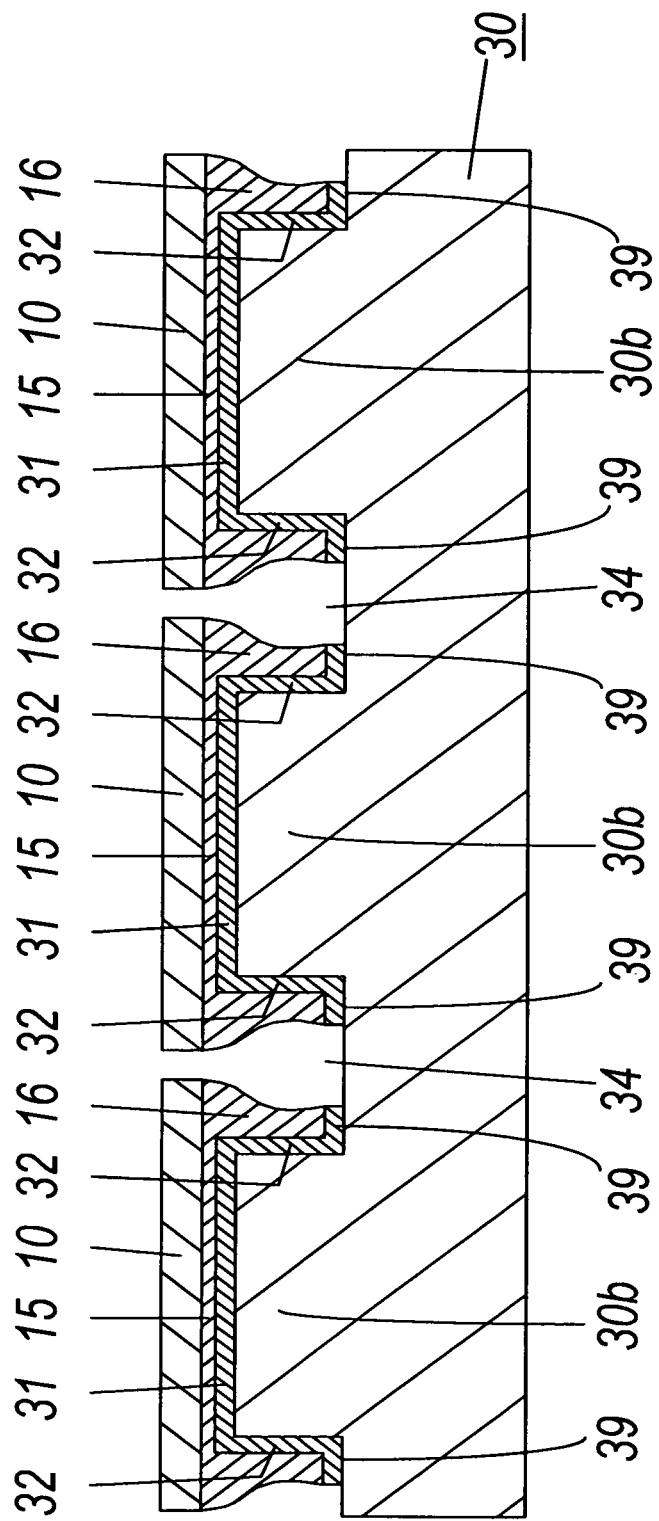
FIG. 6 shows a schematic sectional view of essential part of another example of the dielectric substrate.

As shown in FIG. 6, the solder-leading portion 32 has an extension 39 which extends on the bottom of the groove 34, such that the liquid solder is allowed to flow in wide area after overflowing from the interface between the LED chip 10 and the metal layer 31 which is provided on the supporting platform 30b of the dielectric substrate 30. This configuration can further prevent the solder-ball generation.

Figure 7:
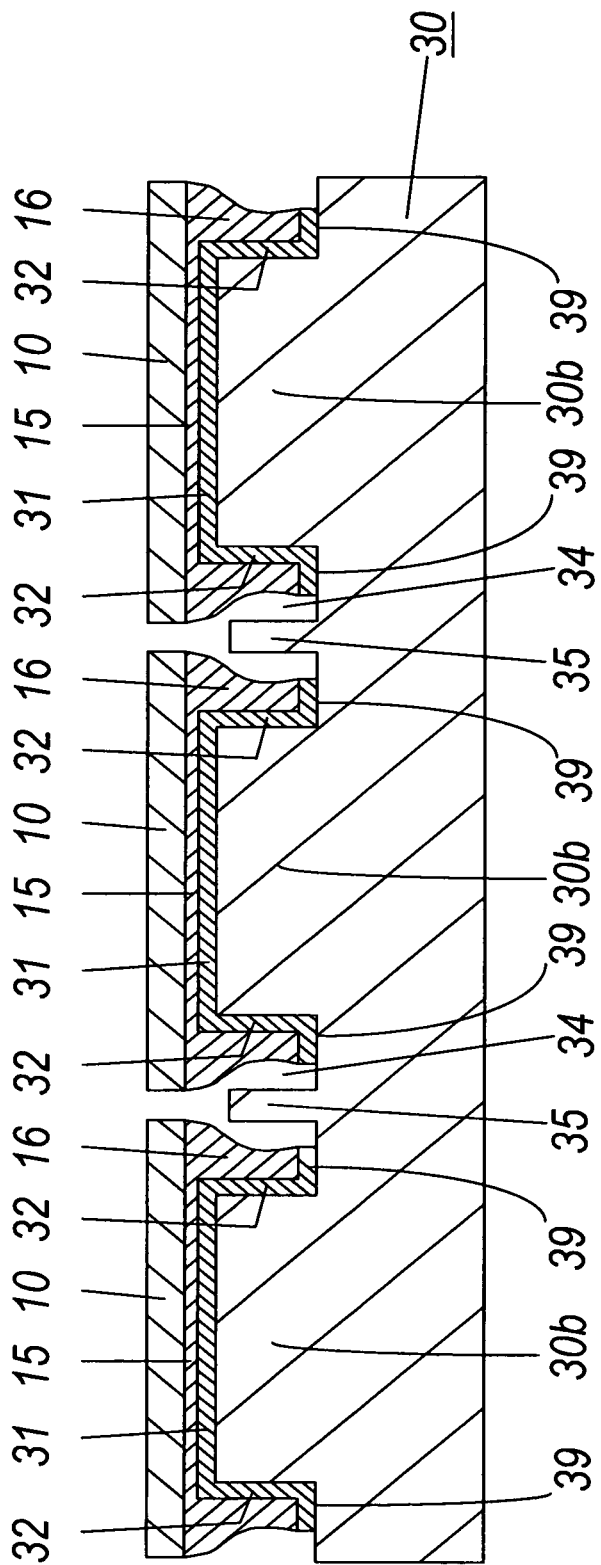
FIG. 7 shows a schematic sectional view of essential part of another example of the dielectric substrate.

As shown in FIG. 7, The groove 34 of the dielectric substrate 30 may be provided at its bottom with a dielectric barrier 35. The barrier 35 enables to inhibit the extra liquid solder from excessively flowing on the groove 34, further preventing short-circuit between the adjacent LED chips 10. The barrier 35 may be made of the same material as the dielectric substrate 30 and formed integrally with the dielectric substrate 30, for the purpose of reducing its fabrication cost and precisely positioning the barriers 35 on the groove 34. The barrier 35 in FIG. 7 is configured to have a top lower than that of the supporting platform 30b, so as to allow the adjacent LED chips 10 to be closely positioned. The barrier 35 needs to be configured to have the same height as that of the supporting platform or less. When having the same height as that of the supporting platform and being made of the same material as that of the dielectric substrate 30, the barrier 35 can be formed simultaneously with the groove 34. The barrier 35 may be formed to the dielectric substrate 30 in FIG. 5.

Figure 8:
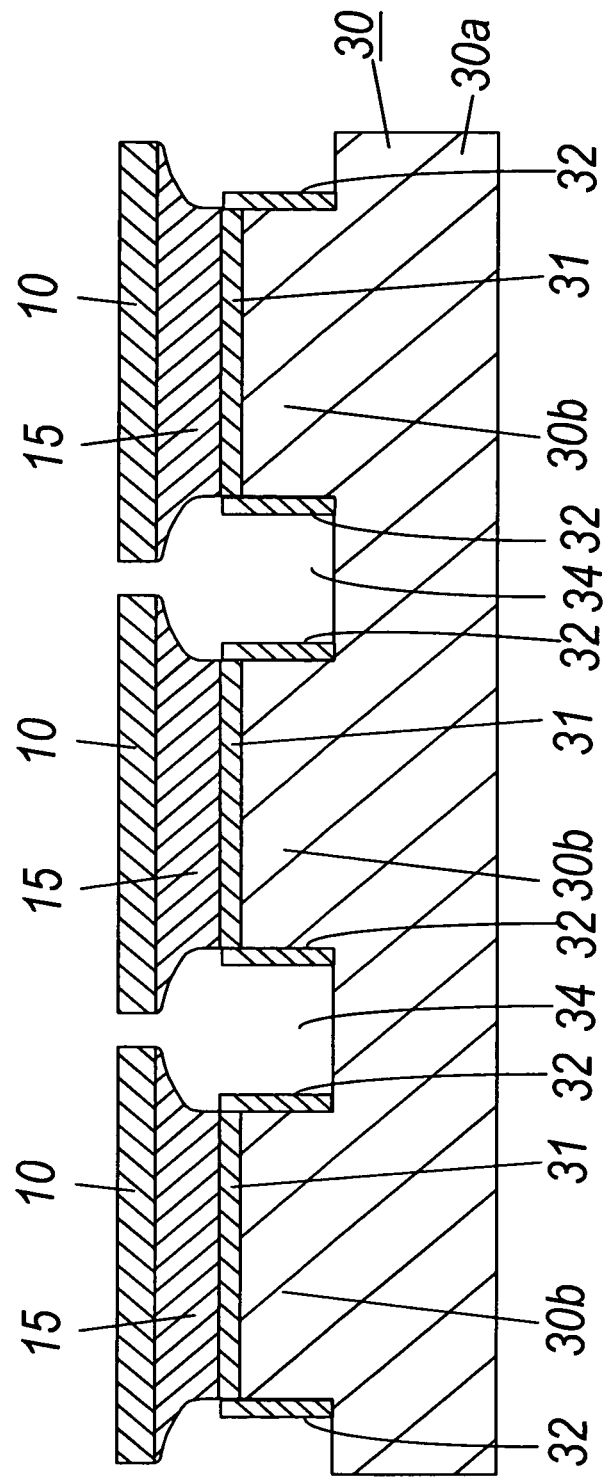
FIG. 8 shows a schematic sectional view of essential part of another example of the dielectric substrate.
Figure 9:
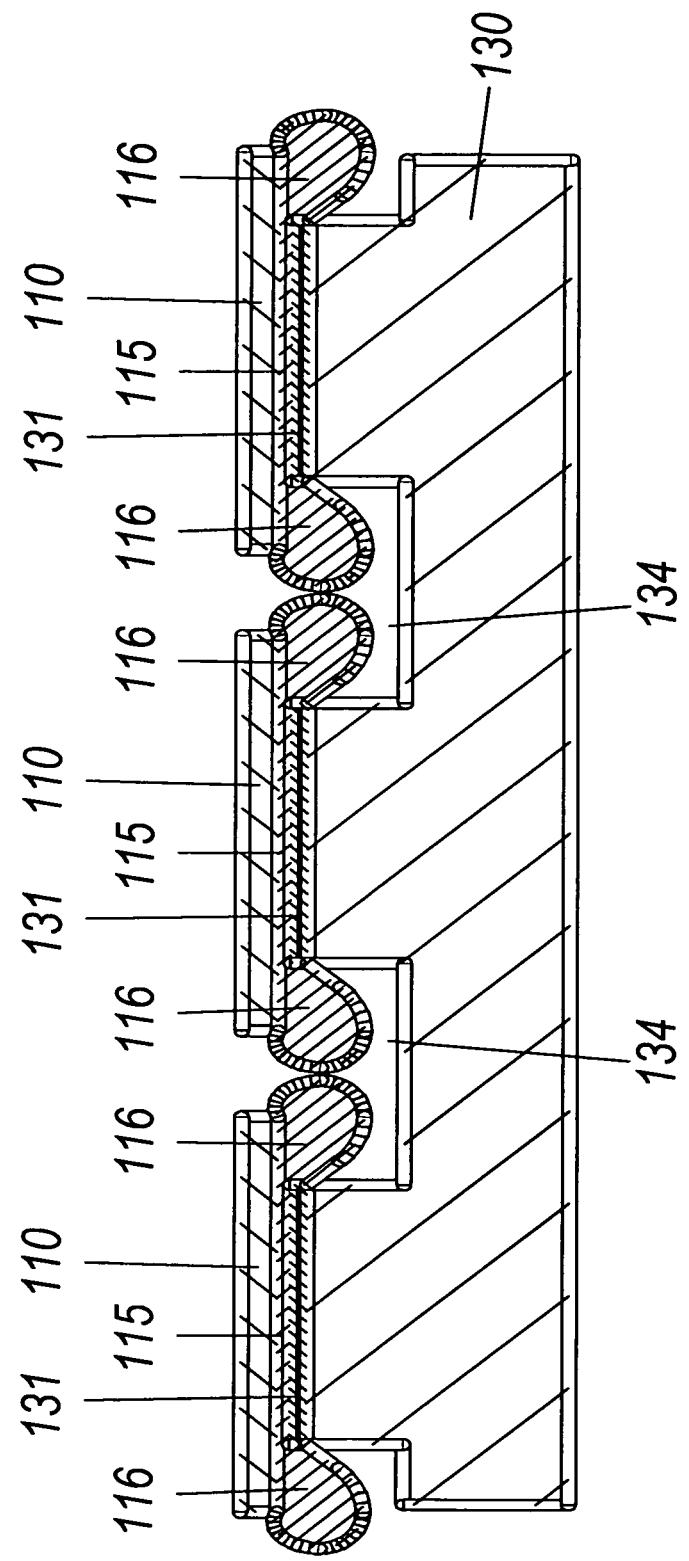
FIG. 9 shows a schematic sectional view of an example of a conventional dielectric substrate.

The LED chip 10 can be connected to the metal layer 31 which is provided on the supporting platform 30b for being precisely positioned by self-alignment process as follows. The solder 15 is applied in suitably amount on the metal layer 31 in advance. Next, the LED chip 10 is disposed to the metal layer 31 by way of the solder 15. In this process, the LED chip 10 is spontaneously positioned, with the help of the surface tension of solder melted by heating. Herein, the supporting platform 30b may be configured to have a plane size smaller than that of the LED chip 10, as shown in FIG. 8. In this process, the LED chip 10 is connected to the metal layer 31 by way of the bonding portion 15 made of solder narrowing towards the metal layer 31, so as to prevent the solder from extending in wider area than a plane size of the LED chip 10. Even when adjacent LED chips 10 are closely positioned, this process enables to prevent short-circuit between the LED chips 10 through bridging solder-balls which result from liquid solder overflowing from the interface between the LED chip 10 and the metal layer 31. Besides, the supporting platform 30b is preferably configured to have a top surface having a shape similar to that of the LED chip 10. In this configuration, the LED chip can be precisely positioned to have almost the same vertical axis as that of the supporting platform in the above self-alignment process. The metal layer 31 may be formed by means of spattering, vapor deposition, plating, or the like.

In the above embodiment, a blue-light LED chip is employed as the LED chip 10. The LED chip 10 may be selected to emit red-light, green-light, purple-light or UV-ray, instead of blue-light. The LED chip 10 may be provided at its surface with a color conversion layer which is made of the same material as that of the color conversion member 70, rather than being covered with the color conversion member 70. The dielectric substrate 30 is provided with a plurality of LED chips 10 respectively emitting light of common luminescent color in the above embodiment, but may be provided with a plurality of LED chips respectively emitting different colors. For example, the dielectric substrate 30 may be provided with red-, green-, and blue-color LED chips 10, rather than being covered with the color conversion member 70. The dielectric substrates 30 may be formed of other material such as a circuit substrate, a ceramic package, or the like, instead of sub-mount member.

The invention claimed is:

1. An LED device comprising;
a plurality of LED chips;
a dielectric substrate;
a plurality of dielectric supporting platforms each formed on a top surface of said dielectric substrate for mounting thereon an LED chip of said plurality of LED chips; and
a plurality of metal layers each formed on a top surface of each of said plurality of dielectric supporting platforms, each of the plurality of metal layers being bonded to one of said plurality of LED chips through solder,
wherein said dielectric supporting platforms are configured to project from the top surface of said dielectric substrate to form a groove between adjacent dielectric supporting platforms of the plurality of dielectric supporting platforms, and
each dielectric supporting platform of the plurality of dielectric supporting platforms is provided at its side surface with a solder-leading portion formed as part of each of the metal layers, said solder-leading portion being made of a material having a higher wettablity to the solder than that of said dielectric supporting platform, wherein said metal layer and said solder-leading portion of the metal layer is made of a different material than that of said solder,
wherein said solder leading portion is directly connected to the solder and the dielectric supporting platform between the solder and the dielectric supporting platform.

2. The LED device as set forth in claim 1, wherein
said solder-leading portion has an extension which extends on a bottom of said groove.

3. The LED device as set forth in claim 2, wherein
said solder-leading portion is made of the same material as that of said metal layer, wherein
each extending length of said extension is shorter than half of the interval between adjacent dielectric supporting platforms of the plurality of dielectric supporting platforms.

4. The LED device as set forth in claim 1, wherein
said groove is provided at its bottom with a dielectric barrier which protrudes between said supporting platforms so as to prevent a short-circuit between adjacent solder-leading portions.

5. The LED device as set forth in claim 3, wherein
said groove is provided at its bottom with a dielectric barrier which protrudes between said supporting platforms so as to prevent a short-circuit between adjacent solder-leading portions.

6. The LED device as set forth in claim 4, wherein
said barrier is configured to have a top lower than that of said supporting platform.

7. The LED device as set forth in claim 5, wherein said barrier is configured to have a top lower than that of said supporting platform.

8. The LED device as set forth in claim 4, wherein said barrier is formed integrally with said dielectric substrate.

9. The LED device as set forth in claim 5, wherein said barrier is formed integrally with said dielectric substrate.

10. The LED device as set forth in claim 6, wherein said barrier is formed integrally with said dielectric substrate.

11. The LED device as set forth in claim 7, wherein said barrier is formed integrally with said dielectric substrate.

12. The LED device as set forth in claim 1, wherein said supporting platform is configured to have a plane size smaller than said LED chip.

13. The LED device as set forth in claim 3, wherein said supporting platform is configured to have a plane size smaller than said LED chip.

14. The LED device as set forth in claim 4, wherein said supporting platform is configured to have a plane size smaller than said LED chip.

15. The LED device as set forth in claim 5, wherein said supporting platform is configured to have a plane size smaller than said LED chip.

16. The LED device as set forth in claim 6, wherein said supporting platform is configured to have a plane size smaller than said LED chip.

17. The LED device as set forth in claim 7, wherein said supporting platform is configured to have a plane size smaller than said LED chip.

18. The LED device as set forth in claim 8, wherein said supporting platform is configured to have a plane size smaller than said LED chip.

19. The LED device as set forth in claim 9, wherein said supporting platform is configured to have a plane size smaller than said LED chip.

20. The LED device as set forth in claim 10, wherein said supporting platform is configured to have a plane size smaller than said LED chip.

21. The LED device as set forth in claim 11, wherein said supporting platform is configured to have a plane size smaller than said LED chip.

22. The LED device as set forth in claim 2, wherein said groove is provided at its bottom with a dielectric barrier which protrudes between said supporting platforms so as to prevent a short-circuit between adjacent solder-leading portions.

23. The LED device as set forth in claim 2, wherein said supporting platform is configured to have a plane size smaller than said LED chip.

24. The LED device as set forth in claim 1, wherein said solder-leading portion is made of the same material as that of said metal layer.

25. The LED device as set forth in claim 24, wherein said solder-leading portion is formed continuously and integrally with said metal layer.

26. The LED device as set forth in claim 1, wherein said solder-leading portion is disposed along an entire surface of each side surface of each dielectric supporting platform.

* * * * *